(12) United States Patent
Lee et al.

(10) Patent No.: US 7,972,958 B2
(45) Date of Patent: Jul. 5, 2011

(54) METHOD OF FABRICATING SEMICONDUCTOR DEVICE

(75) Inventors: Jung-hoon Lee, Suwon-si (KR); Hong-jae Shin, Seoul (KR); Seo-woo Nam, Yongin-si (KR); Sae-il Son, Suwon-si (KR); Sang-doo Kim, Seoul (KR); Jung-deog Lee, Yongin-si (JP); Sang-wook Kwon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 45 days.

(21) Appl. No.: 12/385,982

(22) Filed: Apr. 27, 2009

(65) Prior Publication Data

US 2009/0280645 A1    Nov. 12, 2009

(30) Foreign Application Priority Data

May 7, 2008    (KR) .................. 10-2008-0042452

(51) Int. Cl.
   *H01L 21/44*    (2006.01)
(52) U.S. Cl. .............. 438/664; 438/199; 257/E21.296

(58) Field of Classification Search .............. 438/199, 438/664, E21.296; 257/E21.296
See application file for complete search history.

(56) References Cited

U.S. PATENT DOCUMENTS

| 7,064,025 | B1 | 6/2006 | Fang et al. | |
| 7,741,220 | B2 * | 6/2010 | Iinuma | 438/682 |
| 2006/0128086 | A1 * | 6/2006 | Chidambarrao et al. | 438/199 |
| 2008/0116521 | A1 * | 5/2008 | Lee et al. | 257/369 |

FOREIGN PATENT DOCUMENTS

| JP | 2003-060076 | 2/2003 |
| KR | 10-2005-0078104 | 8/2005 |
| KR | 10-2007-0039384 | 4/2007 |

* cited by examiner

*Primary Examiner* — Phuc T Dang
(74) *Attorney, Agent, or Firm* — Harness, Dickey & Pierce, P.L.C.

(57) ABSTRACT

Provided is a method of fabricating a semiconductor device including a dual silicide process. The method may include sequentially siliciding and stressing a first MOS region, and sequentially siliciding and stressing a second MOS region after siliciding and stressing the first MOS region, the second MOS region being a different type than the first MOS region.

18 Claims, 5 Drawing Sheets

METHOD OF FABRICATING SEMICONDUCTOR DEVICE

PRIORITY STATEMENT

This application claims priority under U.S.C. §119 to Korean Patent Application No. 10-2008-0042452, filed on May 7, 2008, in the Korean Intellectual Property Office (KIPO), the entire contents of which are incorporated herein by reference.

BACKGROUND

1. Field

Example embodiments relate to a method of fabricating a semiconductor device, and more particularly, to a method of fabricating a semiconductor device, including applying both a dual silicide process and a dual stress process.

2. Description of the Related Art

As semiconductor devices become more highly integrated, the line width of transistor gate electrodes becomes narrower, thereby increasing resistance of the gate electrodes. Also, as transistor source/drain junctions become thinner, gate electrode resistance increases. In order to increase the operating speed of semiconductor devices, reducing their resistance is beneficial. In order to reduce resistance of a gate electrode, the gate electrode is formed of a polysilicon layer and a refractory metal silicide layer. Also, in order to reduce resistance of a source/drain region, a refractory metal silicide layer is formed on the source/drain region. For this, a refractory metal is deposited on a polysilicon gate electrode and a source/drain region, and then a silicide is simultaneously formed on both the gate electrode and the source/drain region.

However, when a silicide is formed, thicknesses of silicides of a source/drain region and a gate region of an NMOS region and a PMOS region vary depending on the structures of an active region and a polysilicon gate electrode of the NMOS region and the PMOS region. Thus, resistance Rs varies in the NMOS region and the PMOS region. Also, a silicide may grow in an edge portion of the active region according to the shape of the edge portion of a device isolation layer, and the silicide may cause junction leakage. Because the shape of the edge portion of the device isolation layer in the PMOS region and the NMOS region may vary, excessive growth of the silicide may occur in any region of the PMOS region and the NMOS region. Also, excessively grown silicide may affect resistance Rs of the silicide when critical dimensions (CDs) of an active region and a gate electrode are relatively small, while insignificantly affecting resistance Rs when CDs thereof are relatively large. Thus, the resistance Rs varies depending on the CDs. In order to overcome this problem, a dual silicide process for differently forming a silicide in an NMOS region and a PMOS region may be used.

Furthermore, after the dual silicide process, a stress is applied to a field effect transistor (FET), characteristics of the FET may be improved. A tensile stress increases electron mobility, and a compressive stress increases hole mobility. Accordingly, a tensile stress is applied to a channel of a transistor of an NMOS region to increase electron mobility, thereby increasing drain current of an N-type transistor. Also, a compressive stress is applied to a channel of a transistor of an PMOS region to increase hole mobility, thereby increasing drain current of a P-type transistor.

SUMMARY

The present invention relates to a method of fabricating a semiconductor device including a dual silicide process.

According to one example embodiment, a method of fabricating a semiconductor device may include sequentially siliciding and stressing a first MOS region, and sequentially siliciding and stressing a second MOS region after siliciding and stressing the first MOS region, the second MOS region being a different type than the first MOS region.

The sequentially siliciding and stressing the first MOS region includes forming a silicide protection layer in the second MOS region, siliciding the first MOS region, and stressing the first MOS region. Stressing the first MOS region includes forming a first stress liner over the first MOS region. The sequentially siliciding and stressing the second MOS region includes siliciding the second MOS region using the first stress liner to protect the first MOS region from being silicided, and stressing the second MOS region.

The first MOS region is exposed and a silicide blocking layer is formed in the second MOS region. First metal silicides are formed on the gate electrode and the source/drain region of the exposed first MOS region, and the silicide protection layer is removed. The second MOS region is exposed and a first stress liner is formed in the first MOS region where the first metal silicides are formed. Second metal silicides are formed on the gate electrode and the source/drain region of the exposed second MOS region, and a second stress liner is formed in the second MOS region where the second metal silicides are formed.

The first MOS region may be an NMOS region, and the second MOS region may be a PMOS region. Stressing the first MOS region may include applying a compressive stress, and stressing the second MOS region may include applying a tensile stress. The first MOS region may be a PMOS region, and the second MOS region may be an NMOS region. Stressing the first MOS region may include applying a tensile stress, and stressing the second MOS region may include applying a compressive stress. The silicide protection layer, the first stress liner and the second stress liner may be formed of SiCN, $Si_3N_4$, SiON, SiBN, $SiO_2$, SiC, SiC:H or SiCOH. Each of the first stress liner and the second stress liner may be formed to have a thickness in the range of about 10 Å to about 1,000 Å. The gate electrode may include conductive polysilicon.

Forming the first metal silicides may include forming a first metal layer on the semiconductor substrate and the gate electrode in the first MOS region, and on the silicide protection layer in the second MOS region; forming the first metal silicides on the gate electrode and the source/drain region of the first MOS region by performing a heat treatment process on the portion of the semiconductor substrate where the first metal layer is formed; and removing the first metal layer formed on the silicide protection layer in the second MOS region. The first metal layer may include Ti, Co, Ni, V, Er, Zr, Hf, Mo or Yb, and the first metal layer may further include Pt, V or Sn.

Forming the second metal silicides may include forming a second metal layer on the first stress liner in the first MOS region and on the semiconductor substrate and the gate electrode in the second MOS region; forming the second metal silicides on the gate electrode and the source/drain region of the second MOS region by performing a heat treatment process on the portion of the semiconductor substrate where the second metal layer is formed; and removing the second metal layer formed on the silicide protection layer in the first MOS region. The second metal layer may include Ti, Co, Ni, Pt, Ir or Pd. The second metal layer may further include Pt, V or Sn.

Thin film deposition, photolithography, and etching processes should be repeatedly performed in order to apply both a dual silicide process and a dual stress process, thereby increasing manufacturing costs and time.

BRIEF DESCRIPTION OF THE DRAWINGS

Example embodiments will be more clearly understood from the following detailed description taken in conjunction with the accompanying drawings.

FIGS. 1A through 1J are cross-sectional views for explaining a method of fabricating a semiconductor device, according to example embodiments.

Figure 1A:
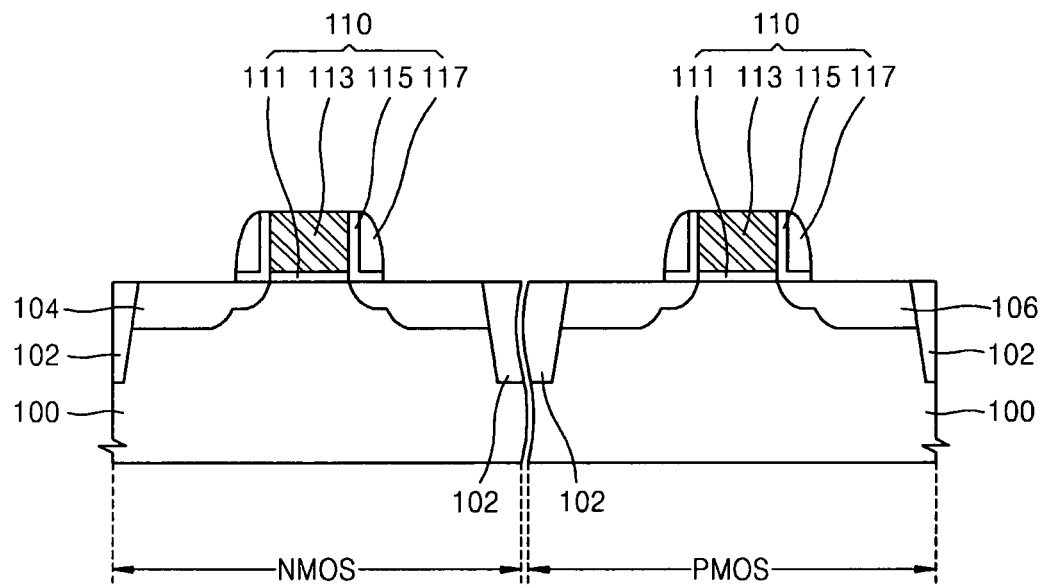
FIGS. 1A-1J represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms, and should not be construed as being limited to the embodiments set forth herein; rather, these embodiments are provided so that this disclosure will be thorough and complete, and will fully convey the concept of example embodiments to those skilled in the art. In the drawings, the thicknesses of layers and regions are exaggerated for clarity. Like reference numerals denote like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A-1J are cross-sectional views for explaining a method of fabricating a semiconductor device, according to example embodiments. Referring to FIG. 1A, a device isolation layer 102 may be formed in a semiconductor substrate 100 to define an active region. The active region may be divided into an NMOS region (NFET region) where an n channel MOSFET is formed and a PMOS region (PFET region) where a p channel MOSFET is formed. Gate electrodes 110 may be formed in the NMOS region and the PMOS region to form source/drain regions 104 and source/drain regions 106, respectively. Each of the gate electrodes 110 may include a gate insulating layer 111 as well as a conductive polysilicon 113, an offset oxide layer 115, and a spacer 117 that are formed on the gate insulating layer 111. The offset oxide layer 115 and the spacer 117 may be formed of a silicon oxide and a silicon nitride, respectively. The gate electrodes 110 may be dual gate electrodes whereby the gate electrode in the NMOS region has a conductivity opposite to that in the PMOS region.

Figure 1B:
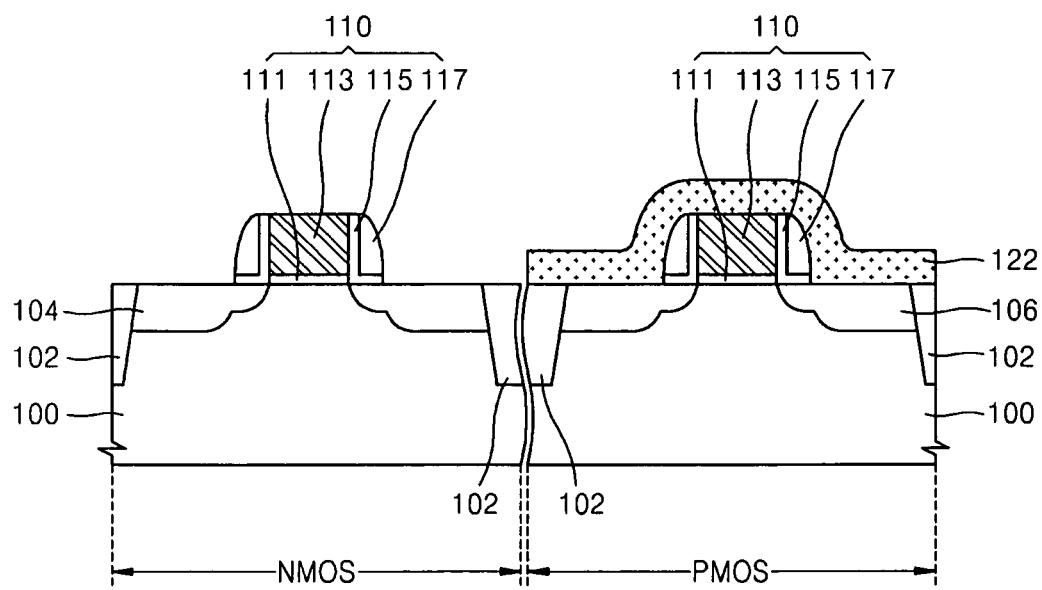

Referring to FIG. 1B, after a silicide protection layer 122 is formed on the entire surface of the semiconductor substrate 100, the portion of the silicide protection layer 122 in the NMOS region is removed using a photographic etching process so as to expose only the NMOS region. The silicide protection layer 122 may be formed of SiCN, $Si_3N_4$, SiON, SiBN, $SiO_2$, SiC, SiC:H or SiCOH. The silicide protection layer 122 may be removed by dry etching or wet etching.

Figure 1C:
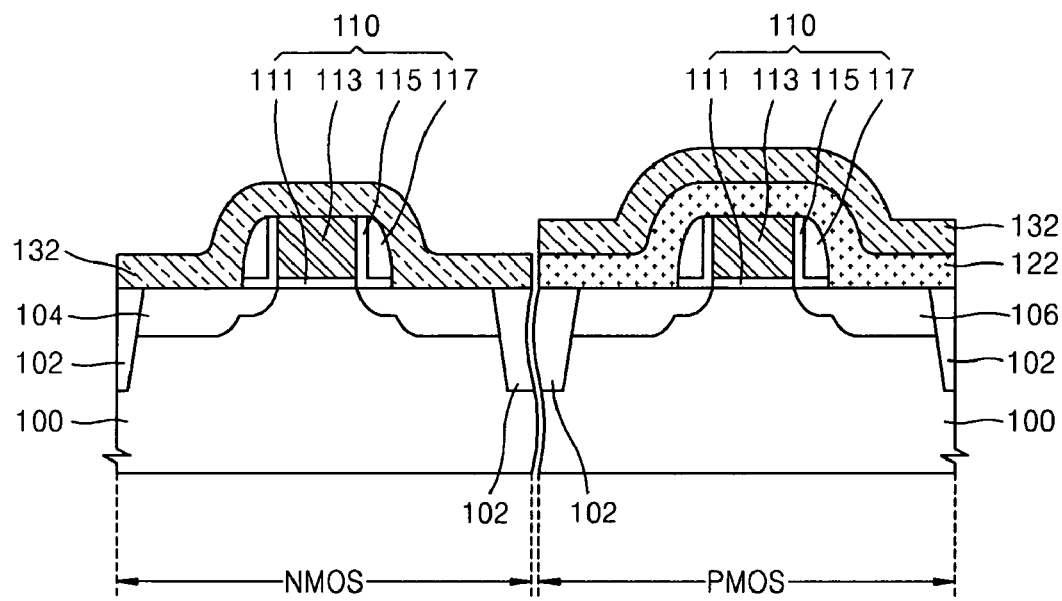

Referring to FIG. 1C, a first metal layer 132 is formed on the entire structure, for example, on the semiconductor substrate 100 and the gate electrode 110 in the NMOS region, and on the portion of the silicide protection layer 122 in the PMOS region. The first metal layer 132 may include Ti, Co or Ni, and may further include Pt, V, or Sn. Also, the first metal layer 132 may include V, Er, Zr, Hf, Mo or Yb, and may further include Pt, V, or Sn. The Pt, V, or Sn may function to increase thermal stability when performing a silicidation reaction. A capping layer (not shown) may be optionally formed on the first metal layer 132. The capping layer helps maintain thermal stability and helps prevent or reduce oxidization of the first metal layer 132 when performing a silicidation reaction.

Figure 1D:
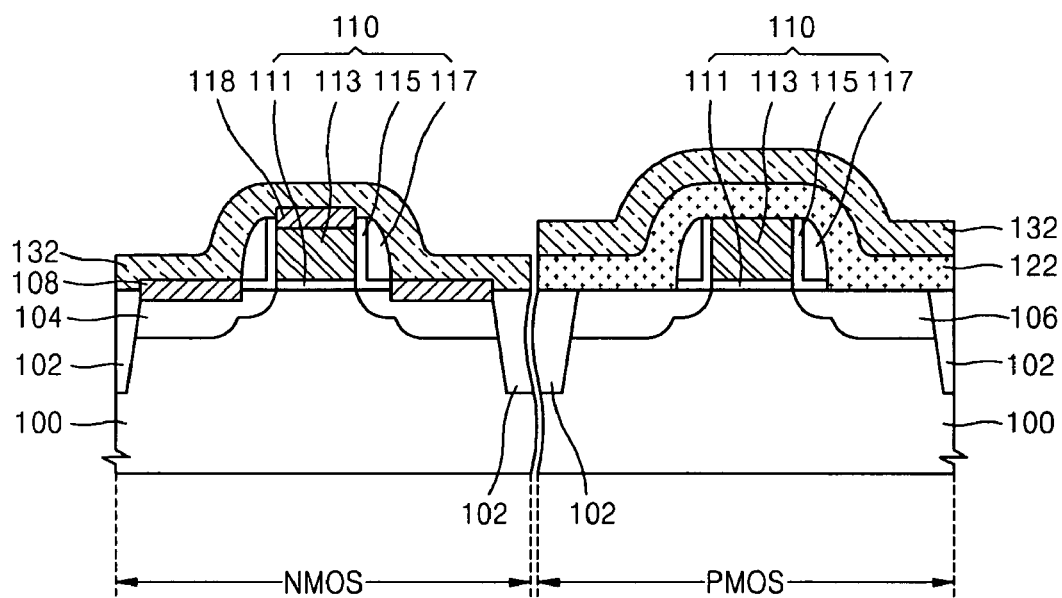

Referring to FIG. 1D, metal silicides 108 and 118 may be formed on the source/drain region 104 and the gate electrode 110 of the NMOS region through a silicidation reaction by performing a heat treatment process on the semiconductor substrate where the first metal layer 132 is formed. The metal silicides 108 and 118 may be formed of $TiSi_2$, $CoSi_2$, NiSi, $VSi_2$, ErSi, $ZrSi_2$, HfSi, $MoSi_2$, CrSi or YbSi. The metal silicides 108 and 118 may include Pt, V, or Sn. In the PMOS region, because the first metal layer 132 is formed on the silicide protection layer 122, a metal silicide may not be formed in the PMOS region.

Figure 1E:
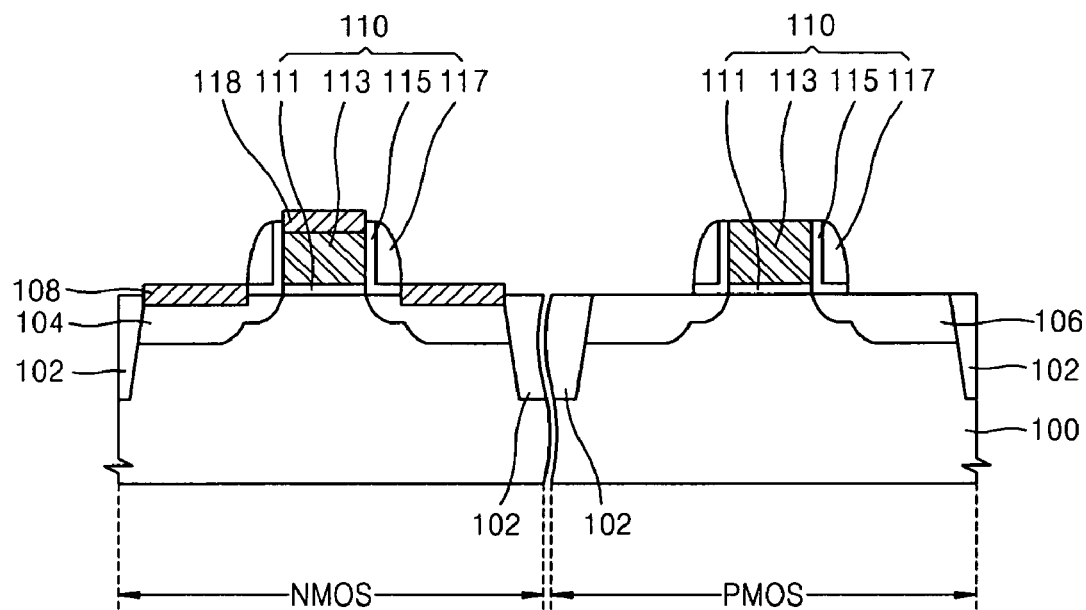

Referring to FIG. 1E, the first metal layer 132 remaining after the silicidation reaction is performed may be removed, and then the portion of the silicide protection layer 122 in the PMOS region may be removed. In the NMOS region, the source/drain region 104 and the gate electrode 110 where the metal silicides 108 and 118 are formed thereon may be exposed. On the other hand, in the PMOS region, the gate electrode 110 and the source/drain region 106 where a metal silicide is not formed thereon are exposed.

Figure 1F:
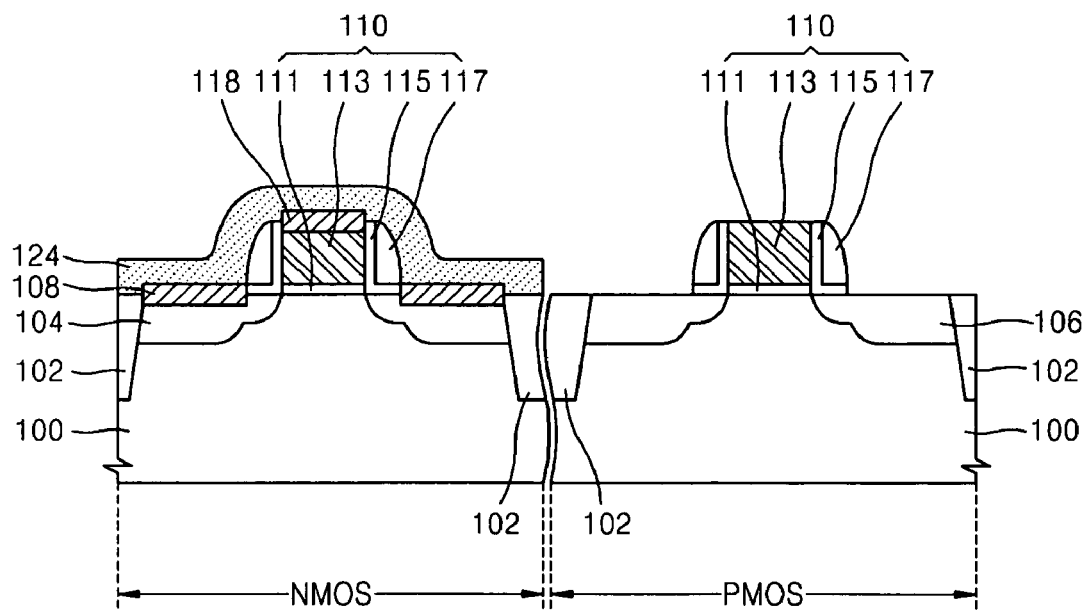

Referring to FIG. 1F, after a first stress liner 124 is formed on the entire structure, the portion of the first stress liner 124 in the PMOS region may be removed, and only the portion of the first stress liner 124 in the NMOS region remains. The first stress liner 124 may be formed so as to apply a compressive stress, and may be formed of SiCN, $Si_3N_4$, SiON, SiBN, $SiO_2$, SiC, SiC:H or SiCOH, similar to the silicide protection layer 122. The first stress liner 124 may be formed to have a thickness in the range of about 10 Å to about 1,000 Å. The first stress liner 124 may increase electron mobility in an N channel by applying a compressive stress to the NMOS region, and also may be used as a silicide protection layer when forming a metal silicide in the PMOS region.

Figure 1G:
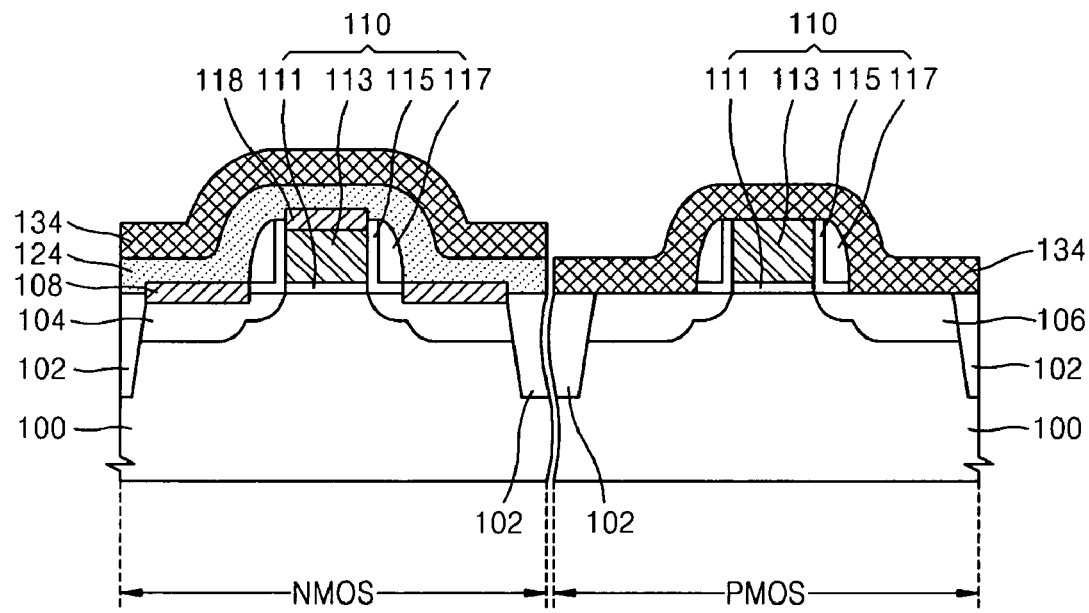

Referring to FIG. 1G, a second metal layer 134 is formed on the entire structure, for example, on the first stress liner 124 in the NMOS region and on the gate electrode 110 and the semiconductor substrate 100 in the PMOS region. The second metal layer 134 may be formed of the same material used to form the first metal layer 132 or formed of some other material. The second metal layer 134 may include Ti, Co or Ni, may further include Pt, V, or Sn. Also, the second metal layer 134 may include Pt, Ir or Pd, and may further include Pt, V or Sn. The second metal layer 134 may be formed to have a thickness different from that of the first metal layer 132. Similar to the first metal layer 132, a capping layer (not shown) may be optionally formed on the second metal layer 134.

Figure 1H:
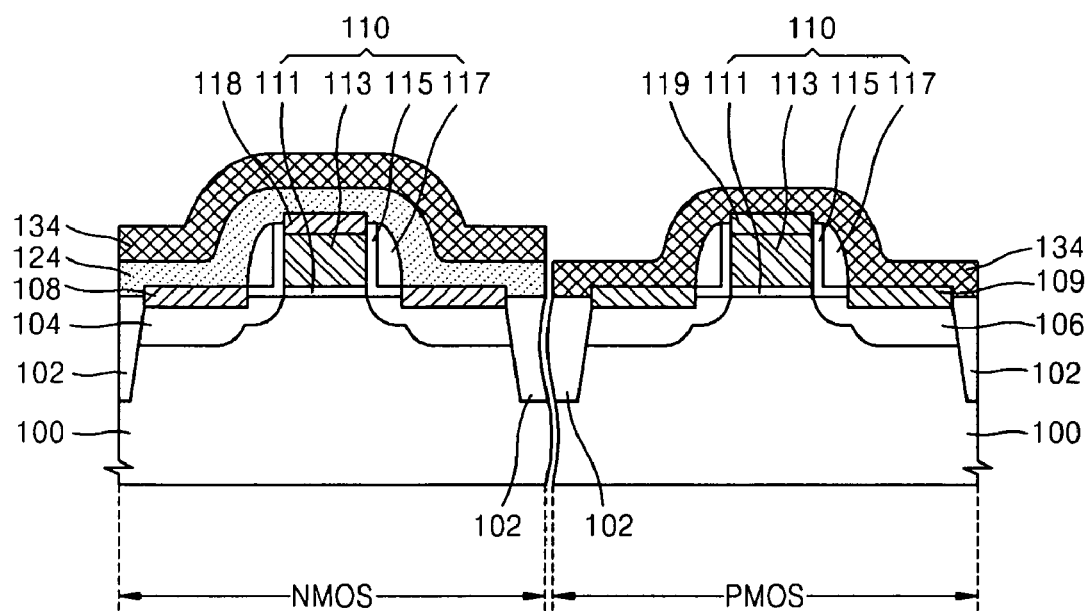

Referring to FIG. 1H, metal silicides 109 and 119 may be formed on the source/drain region 106 and the gate electrode 110 in the PMOS region through a silicidation reaction by performing a heat treatment process on the semiconductor substrate where the second metal layer 134 is formed. The heat treatment process may be performed under different conditions from the heat treatment process for forming the metal silicides 108 and 118 of the NMOS region. The metal silicides 109 and 119 may be formed of $TiSi_2$, $CoSi_2$, NiSi, PtSi, $Pt_2Si$, IrSi or $Pd_2Si$. The metal silicides 109 and 119 may include Pt, V or Sn. In the NMOS region, because the second metal layer 134 is formed on the first stress liner 124, a metal silicide other than the previously formed metal silicides 108 and 118 may not be formed.

Figure 1I:
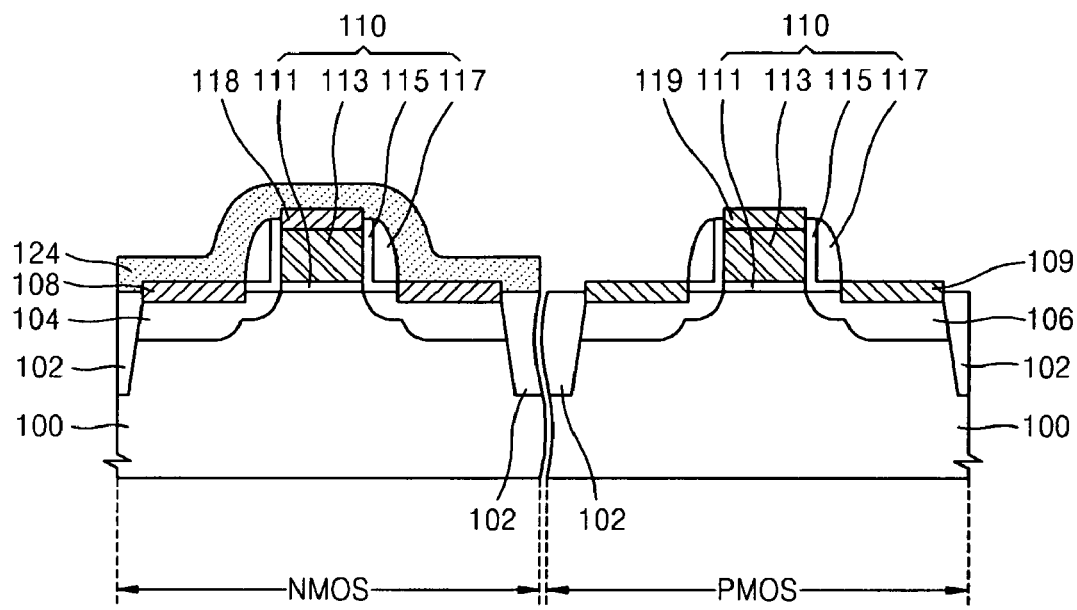

Referring to FIG. 1I, the second metal layer 134 remaining after the silicidation reaction is performed may be removed. The first stress liner 124 may be exposed in the NMOS region, and the source/drain region 106 and the gate electrode 110 where the metal silicides 109 and 119 are formed may be exposed in the PMOS region.

Figure 1J:
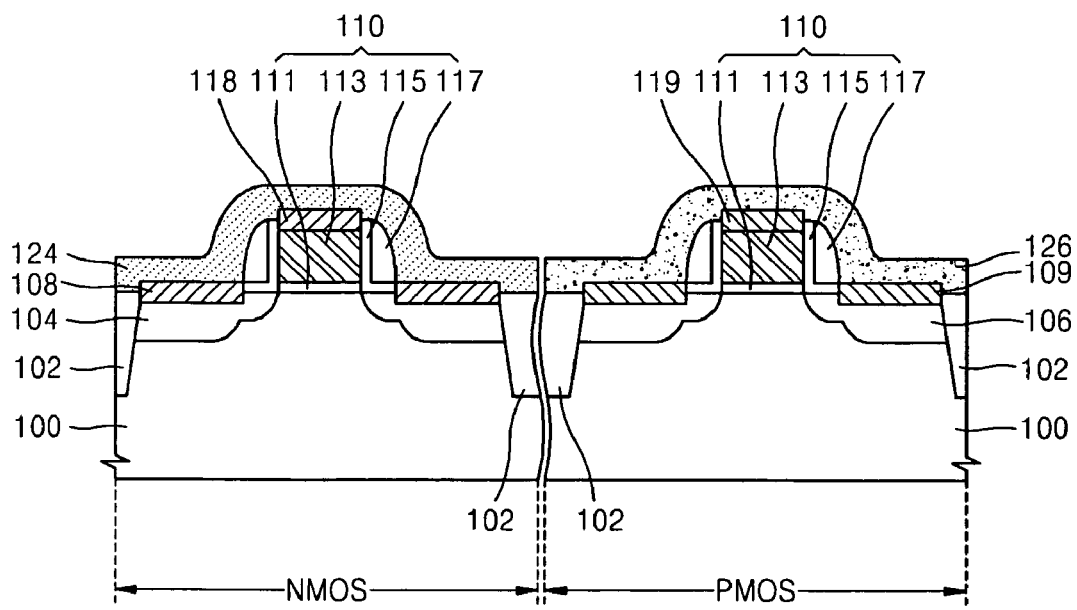

Referring to FIG. 1J, after a second stress liner 126 is formed on the entire structure, the portion of the second stress liner 126 in the NMOS region may be removed, and only the portion of the second stress liner 126 in the PMOS region remains. The second stress liner 126 may be formed to apply a tensile stress and be formed of SiCN, $Si_3N_4$, SiON, SiBN, $SiO_2$, SiC, SiC:H or SiCOH, similar to the first stress liner 124. The second stress liner 126 may be formed to have a thickness in the range of about 10 Å to about 1,000 Å. The second stress liner 126 may increase hole mobility in a P channel and drain current by applying a tensile stress to the PMOS region. In example embodiments, a silicide may be formed in the NMOS region first, and then a silicide may be formed in the PMOS region. However, example embodiments may not be limited thereto, and a silicide may be formed in the PMOS region first, and then a silicide may be formed in the NMOS region.

According to example embodiments, by applying both a dual silicide process and a dual stress liner process, an effect of each process can be obtained. For example, metal silicides of an NMOS region and a PMOS region may be formed of different materials, formed to have different thicknesses, and formed under different conditions, so that resistance Rs of the NMOS region and the PMOS region may be controlled individually and equalized. By controlling a thickness of a silicide and a heat treatment process, excessive growth of a silicide in an edge portion of an active region may be suppressed, and junction leakage may be reduced. Moreover, by suppressing excessive growth of silicide in boundary regions of an active region and of a gate electrode, a difference of resistance Rs generated according to the sizes of the active region and the gate electrode may be minimized or reduced. Also, drain current may be increased by individually increasing carrier mobility in the PMOS region and the NMOS region by using a dual stress process.

By applying a dual stress liner as one of two silicide protection layers required when performing a dual silicide process, the manufacturing process may be simplified compared to a case where a dual silicide process and a stress liner process may be individually applied. For example, by simplifying one of the processes for forming a silicide protection layer, a thin film process, a photolithography process, an etching process and/or a washing process may be omitted, thereby simplifying the manufacturing process and reducing manufacturing costs and time.

According to example embodiments, by simplifying one of the processes for forming two silicide protection layers, both a dual silicide process and a dual stress liner process may be applied. Thus, in addition to simplifying the process, the advantages of each process may be obtained.

While example embodiments have been particularly shown and described with reference to example embodiments thereof, it will be understood by one of ordinary skill in the art that various changes in form and details may be made therein without departing from the spirit and scope of the following claims.

What is claimed is:

1. A method of fabricating a semiconductor device, comprising:
    sequentially siliciding and stressing a first MOS region; and
    sequentially siliciding and stressing a second MOS region after siliciding and stressing the first MOS region, the second MOS region being a different type than the first MOS region,
    wherein the sequentially siliciding and stressing the first MOS region includes forming a silicide protection layer in the second MOS region, siliciding the first MOS region and stressing the first MOS region.

2. The method of claim 1, wherein the silicide protection layer comprises SiCN, Si$_3$N$_4$, SiON, SiBN, SiO$_2$, SiC, SiC:H or SiCOH.

3. The method of claim 1, wherein stressing the first MOS region includes forming a first stress liner over the first MOS region.

4. The method of claim 3, wherein the sequentially siliciding and stressing the second MOS region includes:
    siliciding the second MOS region using the first stress liner to protect the first MOS region from being silicided; and
    stressing the second MOS region.

5. The method of claim 1, wherein the first MOS region is an NMOS region, and the second MOS region is a PMOS region.

6. The method of claim 5, wherein stressing the first MOS region includes applying a compressive stress, and stressing the second MOS region includes applying a tensile stress.

7. The method of claim 1, wherein the first MOS region is a PMOS region, and the second MOS region is an NMOS region.

8. The method of claim 7, wherein stressing the first MOS region includes applying a tensile stress, and stressing the second MOS region includes applying a compressive stress.

9. A method of fabricating a semiconductor device, comprising:
    sequentially siliciding and stressing a first MOS region; and
    sequentially siliciding and stressing a second MOS region after siliciding and stressing the first MOS region, the second MOS region being a different type than the first MOS region, wherein:
    the sequentially siliciding and stressing the first MOS region includes:
        exposing the first MOS region and forming a silicide protection layer in the second MOS region,
        forming first metal silicides on a gate electrode and source/drain regions of the exposed first MOS region and removing the silicide protection layer, and
        exposing the second MOS region and forming a first stress liner in the first MOS region where the first metal silicides are formed; and
    the sequentially siliciding and stressing the second MOS region includes:
        forming second metal silicides on a gate electrode and a source/drain region of the exposed second MOS region, and
        forming a second stress liner in the second MOS region where the second metal silicides are formed.

10. The method of claim 9, wherein each of the first stress liner and the second stress liner comprises SiCN, Si$_3$N$_4$, SiON, SiBN, SiO$_2$, SiC, SiC:H or SiCOH.

11. The method of claim 9, wherein each of the first stress liner and the second stress liner are formed to have a thickness in the range of about 10 Å to about 1,000 Å.

12. The method of claim 9, wherein the gate electrode comprises conductive polysilicon.

13. The method of claim 9, wherein forming the first metal silicides comprises:
    forming a first metal layer on the semiconductor substrate and the gate electrode in the first MOS region, and on the silicide protection layer in the second MOS region;
    forming the first metal silicides on the gate electrode and the source/drain region of the first MOS region by performing a heat treatment process on the semiconductor substrate where the first metal layer is formed; and
    removing the first metal layer formed on the silicide protection layer in the second MOS region.

14. The method of claim 13, wherein the first metal layer comprises Ti, Co, Ni, V, Er, Zr, Hf, Mo or Yb.

15. The method of claim 14, wherein the first metal layer further comprises Pt, V or Sn.

16. The method of claim 9, wherein forming the second metal silicides comprises:
    forming a second metal layer on the first stress liner in the first MOS region and on the semiconductor substrate and the gate electrode in the second MOS region;
    forming the second metal silicides on the gate electrode and the source/drain region of the second MOS region by performing a heat treatment process on the semiconductor substrate where the second metal layer is formed; and
    removing the second metal layer formed on the silicide protection layer in the first MOS region.

17. The method of claim 16, wherein the second metal layer comprises Ti, Co, Ni, Pt, Ir or Pd.

18. The method of claim 17, wherein the second metal layer further comprises Pt, V or Sn.

* * * * *